United States Patent [19]

Sud et al.

[11] Patent Number: 4,570,243
[45] Date of Patent: Feb. 11, 1986

[54] LOW POWER I/O SCHEME FOR SEMICONDUCTOR MEMORIES

[75] Inventors: Rahul Sud; Kim C. Hardee, both of Colorado Springs, Colo.

[73] Assignee: Inmos Corporation, Colorado Springs, Colo.

[21] Appl. No.: 398,990

[22] Filed: Jul. 16, 1982

[51] Int. Cl.[4] .................................................. G11C 7/00
[52] U.S. Cl. ...................................... 365/227; 365/200; 365/203
[58] Field of Search ............... 365/189, 190, 200, 202, 365/203, 205, 208, 210, 227

[56] References Cited

U.S. PATENT DOCUMENTS

| | | | |
|---|---|---|---|
| 4,170,741 | 10/1979 | Williams | 365/205 |
| 4,370,737 | 1/1983 | Chan | 365/203 |
| 4,402,066 | 8/1983 | Itoh et al. | 365/203 |
| 4,455,627 | 6/1984 | Oritani | 365/226 |

Primary Examiner—James W. Moffitt
Attorney, Agent, or Firm—Edward D. Manzo; Roger R. Wise

[57] ABSTRACT

A low power I/O scheme is described which is particularly useful in wide word semiconductor memories which include redundant memory cells as well as regular memory cells. In the present scheme, conventional load transistors for a main data bus are turned off during all write operations to conserve power. In addition, predata lines which carry data between memory cells and the main data buss include load transistors that are turned off during normal read or write operations to conserve additional power, and turned on during spare read or write operations to preserve the stability of unselected regular cells. The predata lines are also preferably held above ground potential during read or write operations to prevent conduction of deselected column select transistors.

8 Claims, 1 Drawing Figure

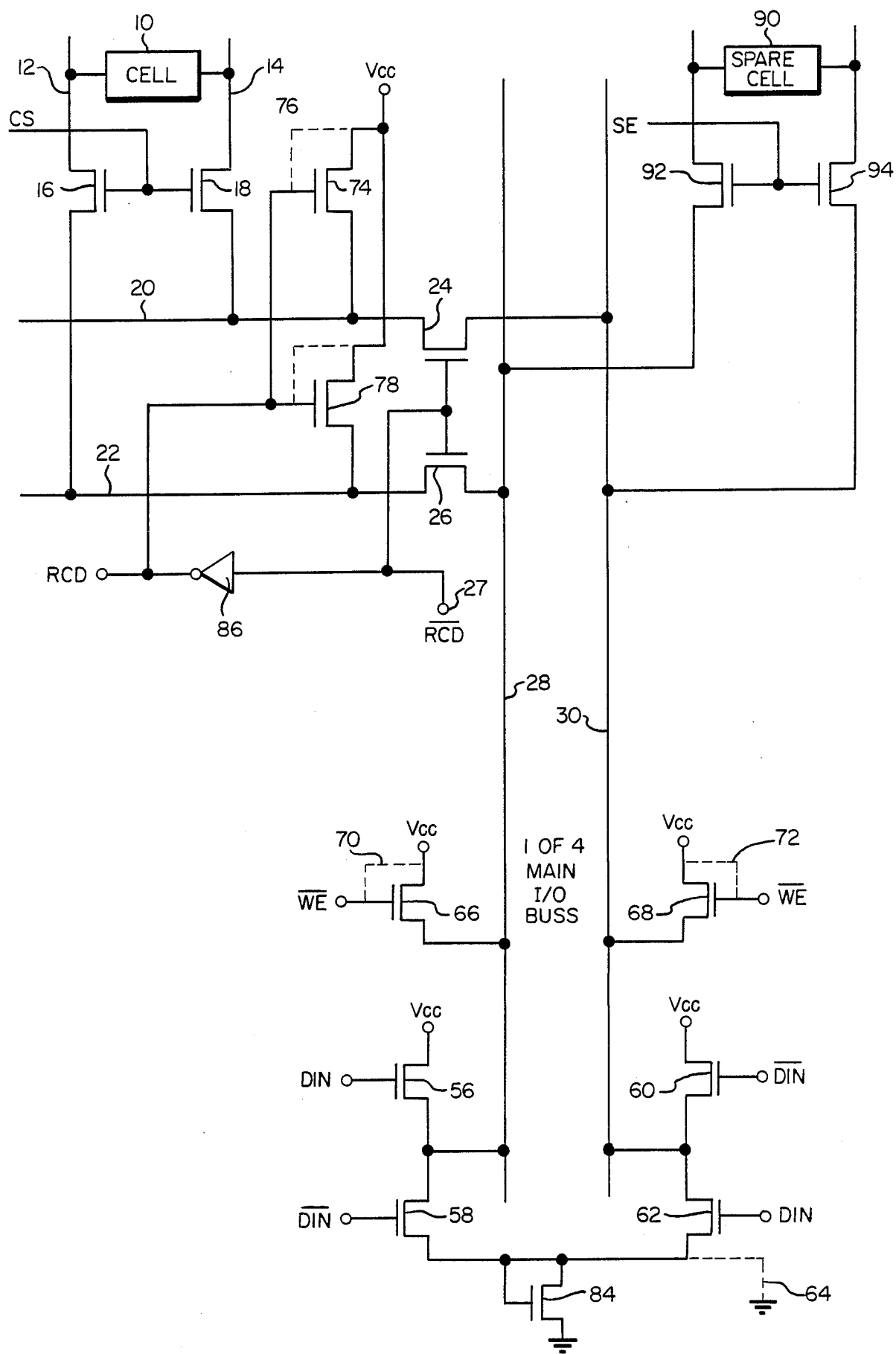

LOW POWER I/O SCHEME FOR SEMICONDUCTOR MEMORIES

BACKGROUND OF THE INVENTION

This invention is generally directed to improvements in semiconductor memories. It is particularly directed to an improved I/O (Input/Output) scheme for semiconductor memories such as static RAMs (Random Access Memories).

Typical I/O schemes for static RAMs of the type considered herein frequently include a plurality of predata lines which couple data from a main data bus to a plurality of memory cells. Externally derived data is applied to the main data bus via a data bus driver.

Generally, the main data bus and the predata lines include D.C. load transistors which are held on during read and write operations. In a 16K by 1 static RAM, these load transistors consume power, but not at a level which is critical.

In wide word memories such as 4K by 4 static RAMs, the I/O scheme may include four times as many predata lines and main data buses. Hence, four times as many D.C. load transistors are required, and the power consumed increases by a factor of four. Consequently, the typical I/O scheme for a narrow word memory has not been directly convertible to a corresponding scheme for a wide word memory using conventional techniques without paying a penalty in terms of power consumption.

OBJECTS OF THE INVENTION

It is a general object of the invention to provide an improved I/O scheme for a semiconductor memory.

It is a more specific object of the invention to provide an I/O scheme which consumes a relatively low level of power and which is suitable for use in wide word semiconductor memories.

BRIEF DESCRIPTION OF THE FIGURE

The objects stated above and other objects of the invention are set forth more particularly in the following detailed description of the sole FIGURE which illustrates a preferred embodiment of a low power I/O scheme for a semiconductor memory according to the invention.

DESCRIPTION OF THE PREFERRED EMBODIMENT

The data I/O scheme of the present invention is described in terms of a specific embodiment which is intended for use in a 4K by 4 (16K) static RAM. It will be understood, however, that the principles of the invention may be employed in other types of wide word memories, or even in narrower word memories of which a 16K by 1 is an example.

Referring now to the FIGURE, a data I/O scheme according to the present invention is shown. This scheme utilizes modified 16K by 1 data I/O circuitry in which dashed lines indicate prior connections which are changed to conserve power during write operations. The memory itself will include a relatively small number of spare (frequently referred to as redundant) memory cells and a relatively large number of columns of regular memory cells. An exemplary regular memory cell 10 is shown as coupled to bit lines 12 and 14. Column select transistors 16 and 18 couple the bit lines 12 and 14 to predata lines 20 and 22 when a column select (CS) signal, applied to the gates of transistors 16 and 18, goes high.

The predata lines 20 and 22 are coupled to a main I/O buss comprising leads 28 and 30 through access transistors 24 and 26, respectively, which are turned on by a signal received from a terminal 27. This signal, identified as $\overline{RCD}$, goes high when data is to be written into or read out of a regular memory cell such as the cell 10 and goes low when data is to be written into or read out of a spare (redundant) memory cell such as cell 90. The signal $\overline{RCD}$ may be generated as described in U.S. Pat. No. 4,459,685. In order to write data into or read data out of space cell 90, spare select transistors 92 and 94 couple the main I/O buss leads 28 and 30 to the spare cell when a spare enable (SE) signal, applied to the gates of transistors 92 and 94, goes high. When a regular memory cell is to be accessed, the SE signal goes low.

In this embodiment, three other main I/O busses (not shown) are coupled via three transistor pairs three respective to predata line pairs (not shown) which are in turn coupled to additional columns of memory cells (also not shown). These transistors respond to the signal $\overline{RCD}$ going high for coupling their associated predata leads to their associated main I/O busses.

Incoming data is coupled to the main I/O busses by data bus drivers such as the driver comprising transistors 56, 58, 60 and 62. As shown, the transistors 56 and 62 receive a data input (Din) at their gates while the transistors 58 and 60 receive a complementary data input ($\overline{Din}$) at their gates. Conventionally, the sources of transistors 58 and 62 have been tied to ground potential as indicated by the dashed line 64. Thus, when Din is high and $\overline{Din}$ is low, the transistor 60 turns off and transistor 62 turns on to pull the lead 30 low. In addition, the transistor 58 is turned off while transistor 56 is turned on for holding the lead 28 at a relatively high level. The voltage levels thus impressed on the main I/O buss leads 28 and 30 may be coupled to the cell 10 via the access transistors 24 and 26, the column select transistors 116 and 18, and the bit lines 12 and 14.

Referring again to the main I/O buss having leads 28 and 30, its leads are coupled to the sources of transistors 66 and 68, respectively. These transistors conventionally have had their gates coupled to their drains and to a supply voltage Vcc as indicated by the dashed lines 70 and 72. With such an arrangement, the transistors 66 and 68 serve as D.C. loads for the main I/O buss leads 28 and 30 and are held in a conductive state during all memory operations.

D.C. loads are also provided for all the predata leads. For example, the predata lead 20 is coupled to the source of a transistor 74. The gate of this transistor has conventionally been coupled to its drain and to the supply voltage Vcc via the dashed lead 76. Hence, this D.C. load transistor 74 has conventionally been remaining conductive during all memory operations.

A constantly conducting D.C. load is provided for the predata lead 22 by means of transistors 78 respectively. Similar D.C. loads (not shown) are also coupled to the predata leads for other regular memory cells.

In a conventional write operation during which Din is high and the predata leads 20 and 22 are selected, the majority of the power consumed is attributable to current flowing to ground from transistor 74 through transistor 62. In the conventional arrangement, current has also flowed to ground from transistor 68 through transistor 62. In a narrow word memory such as a 16K by 1, the power consumed is not unreasonably high. The discussion below demonstrates how such power consumption may be reduced.

Part of the present technique for reducing power includes turning off the load transistors 66 and 68 during a write operation. This is preferably accomplished by removing their gate to drain connections and coupling their gates to a clock signal which goes low during any write operation. Such a signal is indicated as $\overline{WE}$ (not write enable) and may be developed conventionally. By turning off the transistors 66 and 68 during write operations, a substantial amount of power is saved.

Additional power saving could be effected by turning off the load transistors for the predata lines during all write operations, i.e. during normal and spare write operations. For example, removing the drain to gate connections of the transistors 74 and 78 and coupling their gates to the signal $\overline{WE}$ will turn off these transistors during all write operations. However, if such a modification is implemented without compensating circuit changes, two undesirable effects may occur.

The first such effect is a disturbance of the data in unselected memory cells. For example, assume that a write operation is in progress, that transistors 74, 78, 66 and 68 are turned off, and that the sources of transistors 58 and 62 are grounded. If Din is high, the transistors 62 will conduct and pull the bus lead 30 to ground potential because load transistors 68 and 74 are off. Consequentially, the predata lead 20 will also be at ground potential. The access transistors 16 and 18 may be receiving a column select signal which is low to hold them off. However, the column select signal ordinarily does not go all the way to ground potential, so, transistors 16 and 18 will have a few tenths of a volt on their gates. If the predata lead 20 is at ground potential, the threshold voltage of the transistor 18 may be exceeded, thereby permitting it to become somewhat conductive. As a result, data in the unselected memory cells associated with the bit lines 12 and 14 may be disturbed.

The second effect also relates to the disturbance of data in an unselected memory cell, and is of primary concern for semiconductor memories having spare or redundant, memory cells. U.S. Pat. No. 4,459,685, the teachings of which are incorporated herein by reference, discloses an exemplary redundancy system in which this effect should be avoided. Suffice it to say that a memory embodying the present invention will normally include several columns of spare memory cells which may be selected in lieu of a regular column having one or more defective cells. When a redundant cell is selected, access to the regular cells is inhibited by the access transistors such as 24 and 26 being turned off by the signal $\overline{RCD}$ going low.

The problem which arises when a redundant cell is selected and the load transistors for the predata lines are turned off can be explained as follows. Static memory cells having relatively large load resistors are generally stable if the voltage levels on their bit lines are no lower than approximately $2\frac{1}{3}$ to 3 volts. If the voltage on the predata lines drops to a low value because the load transistors are off, that voltage is coupled to bit lines and the data in unselected cells associated with those bit lines can become unstable. To preclude the voltage on the predata lines from dropping to a level which can cause such instability, the load transistors should not be turned off during a spare read or write operation.

To overcome the potential problems described above, two measures are taken. First, the predata lines are held sufficiently above ground potential to preclude the column select transistors, such as transistors 16 and 18, from turning on during a write operation. This is preferably achieved by eliminating the ground connection 64 from the sources of transistors 58 and 62 and by coupling those sources to the drain and gate of a transistor 84 whose source is grounded. The sources of transistors 58 and 62 are thus held to a minimum voltage of one threshold voltage above ground potential. Consequently, when the transistors 62 or 58 conduct, the main I/O buss leads 28 and 30 and the predata lines 20 and 22 are pulled no lower than one threshold voltage above ground potential. Hence, the transistors 16 and 18 are held off when their associated column of cells is deselected even though the column select signal is slightly above ground potential.

The second measure which is taken is to turn the load transistors for the predata lines off during a normal read or write operation to the regular memory cells, and to turn the same transistors on during a spare read or write operation, i.e., during a write to a spare cell. This is preferably accomplished by inverting the signal $\overline{RCD}$ and coupling the inverted signal to the gate of each load transistors for the predata leads. For example, an inverter 86 receives the signal $\overline{RCD}$ which is applied to terminal 27, inverts it, and applies the inverted signal RCD to the gates of transistors 74 and 78. Another inverter (not shown) inverts the signal $\overline{RCD}$ and applies the inverted signal RCD to the gates of other load transistors (not shown) for the other predata lines (also not shown).

With the arrangement shown, all load transistors for the predata lines are turned off during a normal read or write operation (when RCD is low) and turned on during a spare read or write operation (when RCD is high). Thus, power is saved and data in unselected memory cells is not disturbed during a read or write operation to a spare memory cell. In addition, the load transistors 66 and 68 are turned off during all write operations by the signal $\overline{WE}$, thereby providing a further reduction in power consumption. Even with all load transistors turned off during a normal write operation, the column select transistors for an unselected column are held off by maintaining the predata lines above ground potential by means of the transistor 84.

When the present I/O scheme is embodied in a 4K by 4 wide word memory, the circuitry shown in the accompanying figure will be repeated four times. Wider word memories will include a corresponding larger number of similar I/O circuits. It should be understood, however, that the present scheme may also be embodied in a narrow word memory to conserve power.

Although the invention has been described in terms of a preferred embodiment, it will be obvious to those skilled in the art that many alterations and modifications may be made without departing from the invention. Accordingly, it is intended that all such modifications and alterations be considered as within the spirit and scope of the invention as defined by the appended claims.

What is claimed is:

1. In a semiconductor memory having a data buss driver, a plurality of regular memory cells and a plurality of spare memory cells into which data may be written by means of regular write operations and spare write operations, respectively, an input/output scheme for the memory, comprising:

a plurality of predata lines for coupling data to and from the memory cells;

a plurality of first load transistors, each coupled to one of the predata lines;

at least one main data buss for coupling data between the predata lines and the data buss driver;

a plurality of second load transistors coupled to the main data buss;

means for turning off the plurality of first load transistors during a normal read or write operation and for turning on the plurality of first load transistors during a spare read or write operation; and means for turning off the plurality of second load transistors during all write operations.

2. An input/output scheme as set forth in claim 1 wherein the predata lines are coupled to columns of bit lines via column select transistors, and including means for holding the potential on the main data buss above ground potential so as to avoid coupling ground potential to a predata line, thereby reducing the risk of turning on a column select transistor in a non-selected column.

3. An input/output scheme as set forth in claim 2 wherein the data buss driver includes at least one input transistor whose gate receives input data and whose drain is coupled to the main data buss and wherein said means for holding the main data buss above ground potential includes a further transistor coupled between ground and the source of the input transistor so as to limit the minimum potential on the data buss when the input transistor conducts.

4. An input/output scheme as set forth in claim 3 wherein said further transistor has a source coupled to ground potential and a gata and drain which are coupled to the source of the input transistor.

5. An input/output scheme as set forth in claim 1 wherein each of the plurality of first load transistors has a gate adapted to receive a signal for turning it off during a normal read or write operation and for turning it on during a spare read or write operation.

6. An input/output scheme as set forth in claim 5 wherein each of said second load transistors has a gate adapted to receive a clock signal for holding it off during normal and spare write operations.

7. In a semiconductor memory having a data buss driver, a plurality of regular memory cells and a plurality of spare memory cells into which data may be written by means of regular write operations and spare write operations, respectively, and input/output scheme for the memory, comprising:

a plurality of predata lines for coupling data to and from the memory cells;

a plurality of first load transistors each coupled between a supply voltage and one of the predata lines and each adapted to be turned off during a normal read or write operation and turned on during a spare read or write operation;

at least one main data buss for coupling data between the predata lines and the data buss driver;

a plurality of second load transistors coupled between the main data buss and a supply voltage, each of the latter transistors being clocked off during normal and spare write operations; and means for holding the potential on the predata lines above ground potential during a write operation.

8. An input/output scheme as set forth in claim 7 wherein the predata lines are coupled to the main data buss via access transistors which are enabled by a signal during normal read or write operations, and further including means for inverting said signal and for applying it to said first load transistors so as to disable them during a normal read or write operation.

* * * * *